United States Patent
Sen Gupta et al.

(10) Patent No.: US 12,432,948 B2
(45) Date of Patent: Sep. 30, 2025

(54) COMPOSITIONAL ENGINEERING OF SCHOTTKY DIODE

(71) Applicant: Intel Corporation, Santa Clara, CA (US)

(72) Inventors: Arnab Sen Gupta, Hillsboro, OR (US); Urusa Alaan, Hillsboro, OR (US); Justin Weber, Portland, OR (US); Charles C. Kuo, Union City, CA (US); Yu-Jin Chen, Hillsboro, OR (US); Kaan Oguz, Beaverton, OR (US); Matthew V. Metz, Portland, OR (US); Abhishek A. Sharma, Hillsboro, OR (US); Prashant Majhi, San Jose, CA (US); Brian S. Doyle, Portland, OR (US); Van H. Le, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1004 days.

(21) Appl. No.: 17/133,599

(22) Filed: Dec. 23, 2020

(65) Prior Publication Data

US 2022/0199839 A1 Jun. 23, 2022

(51) Int. Cl.
*H10D 8/60* (2025.01)
*H10D 62/86* (2025.01)
*H10D 64/64* (2025.01)
*H10D 84/80* (2025.01)

(52) U.S. Cl.
CPC ............. *H10D 8/60* (2025.01); *H10D 62/86* (2025.01); *H10D 64/64* (2025.01); *H10D 84/811* (2025.01)

(58) Field of Classification Search
None
See application file for complete search history.

(56) References Cited

U.S. PATENT DOCUMENTS

| | | |
|---|---|---|
| 2009/0289251 A1 | 11/2009 | Kiyotoshi |
| 2017/0186905 A1* | 6/2017 | Shur ................ C30B 25/04 |
| 2019/0326403 A1 | 10/2019 | Pillarisetty |

(Continued)

OTHER PUBLICATIONS

Chen et al. "Low-Temperature Fabrication of Solution-Processed InGaZnO Thin-Film Transistors by Three-Layer Gradient Diffusion" (ECS Journal of Solid State Science and Technology, 8 (8) R97-R103 (2019) (Year: 2019).*

(Continued)

*Primary Examiner* — Xiaoming Liu
(74) *Attorney, Agent, or Firm* — Schwabe, Williamson & Wyatt P.C.

(57) ABSTRACT

Embodiments disclosed herein include semiconductor devices with Schottky diodes in a back end of line stack. In an embodiment, a semiconductor device comprises a semiconductor layer, where transistor devices are provided in the semiconductor layer, and a back end stack over the semiconductor layer. In an embodiment, a diode is in the back end stack. In an embodiment, the diode comprises a first electrode, a semiconductor region over the first electrode, and a second electrode over the semiconductor region. In an embodiment, a first interface between the first electrode and the semiconductor region is an ohmic contact, and a second interface between the semiconductor region and the second electrode is a Schottky contact.

8 Claims, 8 Drawing Sheets

(56) References Cited

U.S. PATENT DOCUMENTS

2020/0105744 A1* 4/2020 Dasgupta .......... H01L 21/02389
2020/0350441 A1* 11/2020 Alkhalil ............. H10D 30/6755

OTHER PUBLICATIONS

Zhang et al. ("Progress in rectifying-based RRAM passive crossbar array" Sci China Tech Sci Apr. 2011 vol. 54 No. 4). (Year: 2011).*
He et al. "Defect Self-Compensation for High-Mobility Bilayer InGaZnO/In2O3 Thin-Film Transistor" (Adv. Electron. Mater. 2019, 1900125) (Year: 2019).*
Search Report from European Patent Application No. 21194481.4, mailed Jun. 13, 2022, 13 pgs.
Zhou Xianda et al: "Low-Temperature-Processed Power Schottky Diode Based on Amorphous Indium-Tin-Zinc-Oxide/Indium-Gallium-Zinc-Oxide Bilayer", IEEE Transactions on Electron Devices, IEEE, USA, vol. 66, No. 11, Nov. 1, 2019 (Nov. 1, 2019), pp. 4759-4763, XPO11755526, ISSN: 0018-9383, DOI: 10.1109/TED.2019.2940720 [retrieved on Oct. 28, 2019].
Partial Search Report from European Patent Application No. 21194481.4, mailed Mar. 9, 2022, 16 pgs.

* cited by examiner

COMPOSITIONAL ENGINEERING OF SCHOTTKY DIODE

TECHNICAL FIELD

Embodiments of the disclosure are in the field of semiconductor structures and processing and, in particular, to Schottky diodes for back end of line (BEOL) memory selectors.

BACKGROUND

Offloading memory from the semiconductor substrate to the back end of line (BEOL) stack is a growing trend in the semiconductor manufacturing industry. In order to have functional memory arrays in the BEOL stack, selectors are needed for the memory array. Currently, ovonic threshold switches are one example of a device that can be used as the memory selector. However, ovonic threshold switches are limited by high voltages and slow switching speeds. Another selector architecture is the use of silicon PN diodes. Such architectures are limited by BEOL layer transfer. That is, the silicon PN diodes cannot be integrated directly into the BEOL stack since the annealing temperatures exceed limits of the BEOL stack. Additionally, silicon PN diodes have a high ideality factor and slow switching speeds.

DESCRIPTION OF THE EMBODIMENTS

Figure 1:
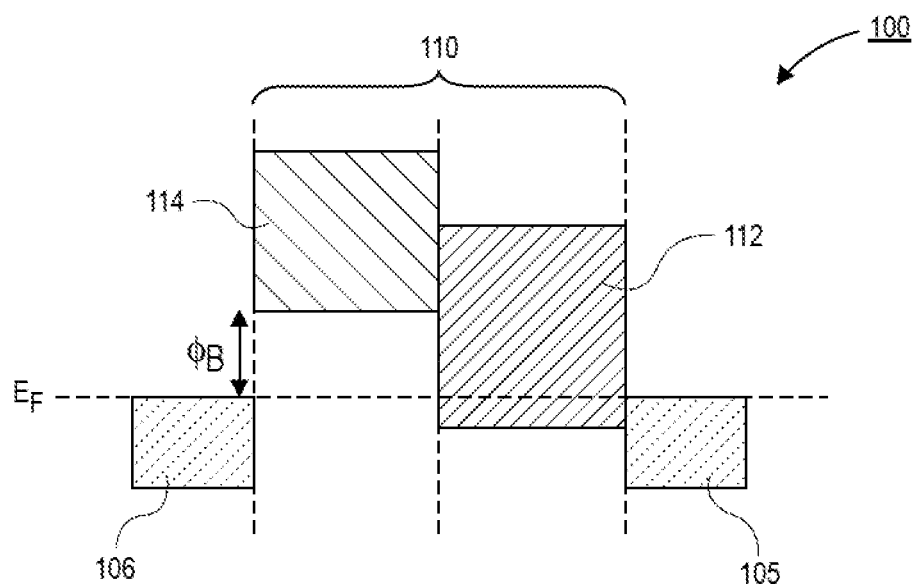
FIG. 1 is a chart of the band diagram of a Schottky diode formed with a bilayer semiconductor region, in accordance with an embodiment.

Embodiments described herein comprise Schottky diodes for back end of line (BEOL) memory selectors. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

As noted above, memory selectors for back end of line (BEOL) memory arrays are currently suboptimal. Accordingly, embodiments disclosed herein include Schottky diodes that are BEOL compatible. Schottky diodes allow for much higher switching speeds than ovonic threshold switches and silicon PN diodes. In situations where the electrodes of the Schottky diode need to be the same (i.e., a symmetric diode), there needs to be some asymmetry in the semiconductor material that allows for the creation of a Schottky contact on one end and an ohmic contact on the other end.

In order to provide an asymmetric semiconductor region, various approaches are provided herein. In a first embodiment, the semiconductor region utilizes a bilayer approach. In a bilayer approach, a first semiconductor material is provided over a first electrode, and a second semiconductor material is provided over the first semiconductor material. An exemplary band diagram of such a configuration is shown in FIG. 1.

As shown in the diode 100 in FIG. 1, a semiconductor region 110 comprises a first semiconductor material 112 interfaces with a first electrode 105. The band structure at this point provides an ohmic connection since the band of the first semiconductor material 112 overlaps the first electrode 105. The second semiconductor material 114 of the semiconductor region 110 has a band-gap $\phi_B$ with the second electrode 106. As such, a Schottky contact is provided. It is to be appreciated that engineering the material of the semiconductor region, as opposed to the electrodes 105/106, allows for more Schottky-like behavior of the diode (e.g., faster switching and lower reverse-bias leakage).

Those skilled in the art will appreciate that, when dealing with BEOL material constraints, the selection of the semiconductor materials for the diode may be more limited than what is available in front end of line processing. Additionally, the material selection is limited by the necessary band offsets. However, oxide, chalcogenide, group III-V, and group II-VI semiconductors are strong candidates for such Schottky diode applications due to the wide variety in properties, because they are easily engineered, and often are BEOL compatible. One specific embodiment can utilize the tunability of multi-elemental materials through modification of electrical properties by altering the stoichiometry. For example consider an oxide semiconductor $(ABC)_3O_x$, where A, B and C are cations, O is oxygen, and x is a marker denoting that the compound does not need to be stoichiometric. In situations where $(ABC)_3O_x$ is a semiconductor, and $ABO_x$ is more insulating and $BCO_x$ is more conducting, a gradient in composition from $ABO_x$ to $BCO_x$ can be created such that there is also an electrical gradient within the film. This can be done with binary and ternary compounds as well as those with many more elements. For example, in one embodiment, $ABO_x$ to $BO_x$ could also be a working scheme. One specific embodiment may include the use of In—Ga—Zn oxide material systems, where gallium zinc oxide forms the Schottky side while indium oxide creates the ohmic side of the interface. Another specific embodiment is the $SrTiO_3$ system with a gradient to an ohmic side of the diode with $SrRuO_3$.

Figure 2:
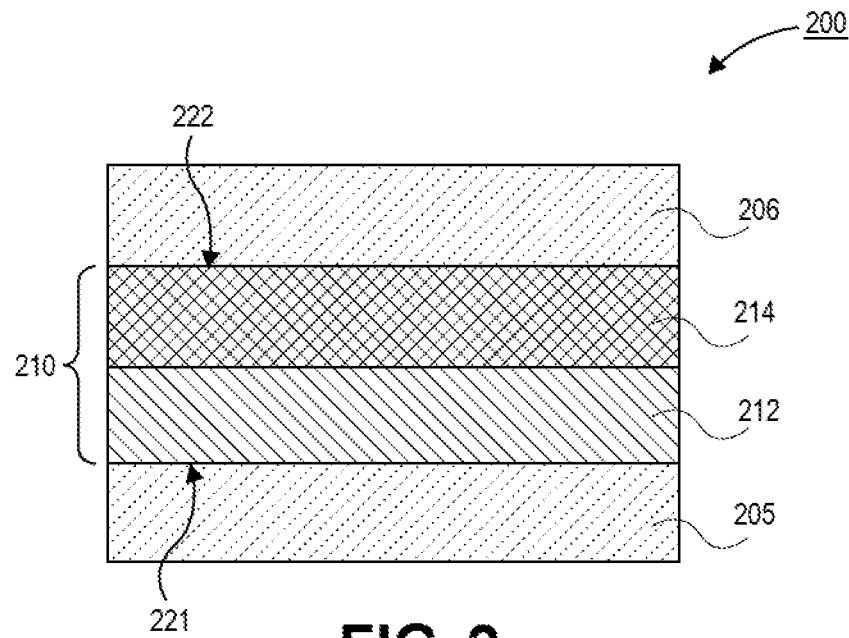
FIG. 2 is a cross-sectional illustration of a Schottky diode with a bilayer semiconductor region, in accordance with an embodiment.

Referring now to FIG. 2, a cross-sectional illustration of a diode 200 is shown, in accordance with an embodiment. In an embodiment, the diode 200 may comprise a first electrode 205 and a second electrode 206. In some embodiments, the first electrode 205 and the second electrode 206 comprise the same material. For example, the first electrode 205 and the second electrode 206 may comprise copper. In other embodiments, the electrodes 205 and 206 can be different materials. In an embodiment, a semiconductor region 210 is provided between the first electrode 205 and the second electrode 206. The semiconductor region 210 may comprise a bilayer architecture. That is, a first layer 212 may have a first interface 221 with the first electrode 205, and a second layer 214 may have a second interface 222 with the second electrode 206. In an embodiment, the first layer 212 is chosen so that an ohmic contact is provided at the first interface 221, and the second layer 214 is chosen so that a Schottky contact is provided at the second interface 222.

In an embodiment, the first layer 212 and the second layer 214 may be any BEOL compatible semiconductor materials. In a particular embodiment, the first layer 212 comprises $In_2O_3$, and the second layer 214 comprises IGZO. It is to be appreciated that many other material systems may also be used to form the ohmic contact and the Schottky contact, including a vast array of oxides, chalcogenides, and virtually all semiconductor systems. It is to be appreciated that the interface between the first layer 212 and the second layer 214 may lead to a conduction barrier. In some embodiments, the conduction barrier may be leveraged in order to reduce reverse bias leakage. However, the barrier may also result in a detrimental impact of forward bias.

Figure 3:
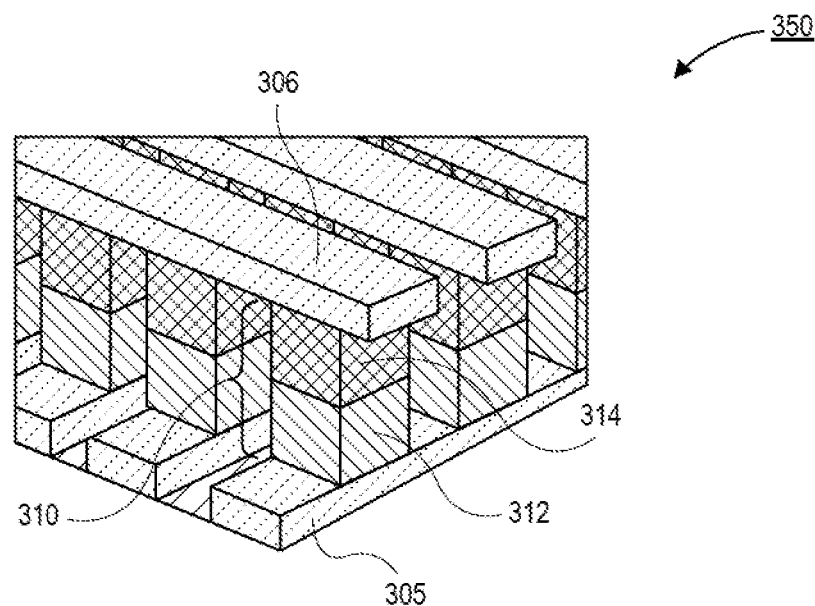
FIG. 3 is a perspective view illustration of an array of Schottky diodes in a BEOL stack, in accordance with an embodiment.

Referring now to FIG. 3, a perspective view illustration of a semiconductor device 350 is shown, in accordance with an embodiment. The illustrated portion of the semiconductor device 350 is a pair of metal layers in the BEOL stack. It is to be appreciated that a semiconductor substrate comprising transistors and the like may be provided below the BEOL stack. As shown, a plurality of Schottky diodes are provided in an array. The first electrodes 305 may be part of a first metal layer in the BEOL stack, and the second electrodes 306 may be part of a second metal layer in the BEOL stack. The semiconductor regions 310 (which comprise the first semiconductor layer 312 and the second semiconductor layer 314) are provided between the two metal layers. In the particular embodiment shown in FIG. 3B, the first electrodes 305 extend in a first directions, and the second electrodes 306 extend in a second direction that is substantially orthogonal to the first directions. It is to be appreciated that each first electrode 305 and second electrode 306 may be coupled to a plurality of semiconductor regions 310.

One solution for reducing the detrimental impact to forward bias resulting from the interface between the first semiconductor layer 312 and the second semiconductor layer 314 is to provide a semiconductor region with a single layer that comprises a compositional gradient. An example of such an embodiment is shown in FIG. 4.

Figure 4:
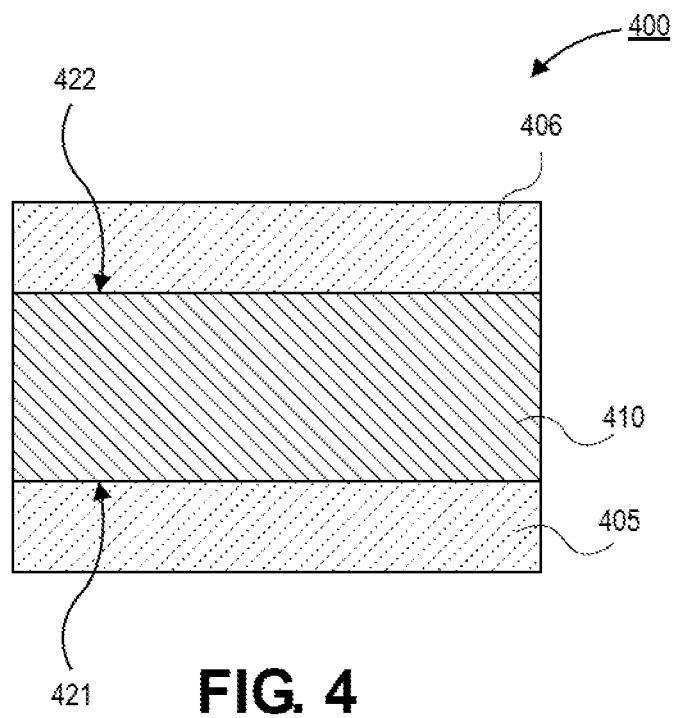
FIG. 4 is a cross-sectional illustration of a Schottky diode with a compositional gradient, in accordance with an embodiment.

Referring now to FIG. 4, a cross-sectional illustration of a diode 400 is shown, in accordance with an embodiment. As shown, a semiconductor region 410 with a single layer is provided between the first electrode 405 and the second electrode 406. While shown as a single layer, it is to be appreciated that the semiconductor region 410 may comprise a compositional gradient through its thickness. For example, a composition at the first interface 421 may be engineered to provide an ohmic contact, and a composition at the second interface 422 may be engineered to provide a Schottky contact. In a particular embodiment, the semiconductor region 410 at the first interface 421 may comprise $In_2O_3$ and the semiconductor region 410 at the second interface 422 may comprise GZO. In an embodiment, the compositional gradient may be formed using binary oxide targets in a physical vapor deposition (PVD) process to grow the semiconductor region 410 such that the defects of interest accumulate on one side of the semiconductor region 410.

In addition to a binary oxide target PVD process, embodiments include several other methods of forming a compositional gradient in the semiconductor region 410. For example, an implantation process and/or a sacrificial layer with a diffusion process may be used. Examples of such processes are provided with respect to FIGS. 5A-5C and FIGS. 6A-6E.

Figure 5A:
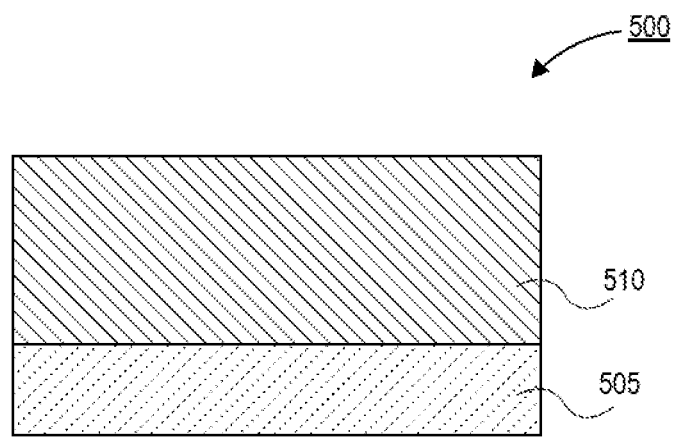
FIGS. 5A-5C are cross-sectional illustrations depicting a process for forming a Schottky diode with a compositional gradient using an implantation and anneal process, in accordance with an embodiment.

Referring now to FIG. 5A, a cross-sectional illustration of a portion of a diode 500 is shown, in accordance with an embodiment. As shown, the diode 500 may comprise a first electrode 505 and a semiconductor region 510 over the first electrode 505. The semiconductor region 510 may comprise a single material composition. That is, the semiconductor region 510 may comprise a single material composition through its thickness. For example, the semiconductor region 510 may comprise $In_2O_3$.

Figure 5B:
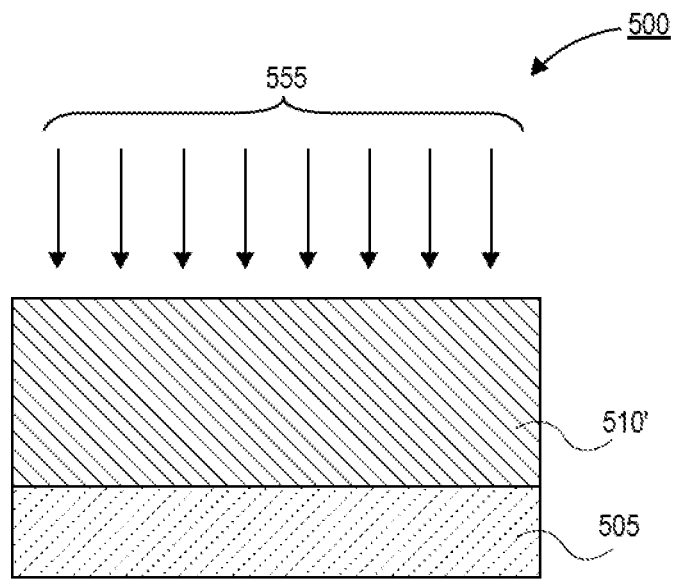

Referring now to FIG. 5B, a cross-sectional illustration of the diode 500 during an implantation process is shown, in accordance with an embodiment. In an embodiment, dopants 555 are implanted into the top surface of the semiconductor region 510 to form implanted semiconductor region 510'. The implant may be done in an ambient environment or with a plasma. The implanted semiconductor region 510' results in a semiconductor with a highly doped top surface. In an embodiment, the dopants may comprise gallium and/or zinc.

Figure 5C:
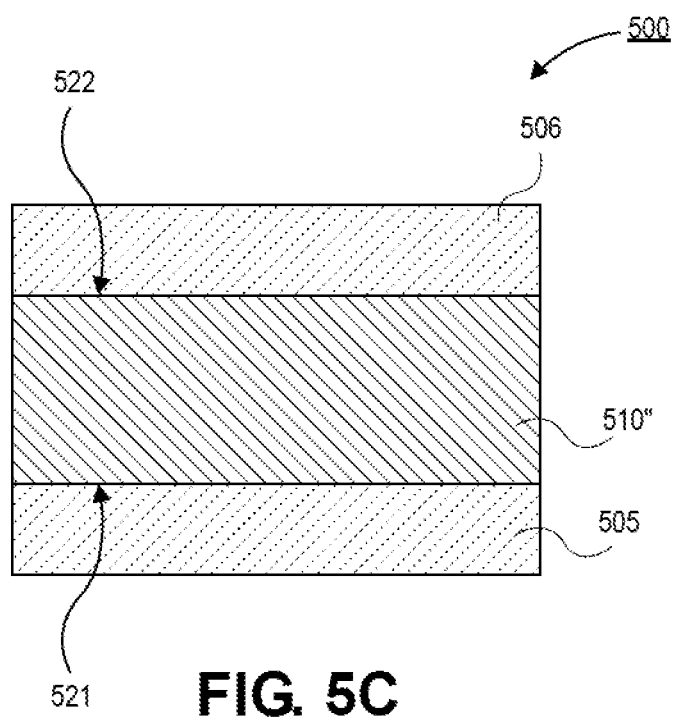

Referring now to FIG. 5C, a cross-sectional illustration of the diode 500 after an annealing process is used to form a compositional gradient semiconductor region 510". The anneal drives diffusion of the dopants through a thickness of the semiconductor region 510" in order to form the compositional gradient. After the annealing process, a second electrode 506 may be disposed over the compositional gradient semiconductor region 510". In an embodiment, the compositional gradient results in a first interface 521 with an ohmic contact, and a second interface 522 with a Schottky contact.

Referring now to FIGS. 6A-6E, a series of cross-sectional illustrations depicting a process for forming a diode with a compositional gradient semiconductor region is shown, in accordance with an additional embodiment.

Figure 6A:
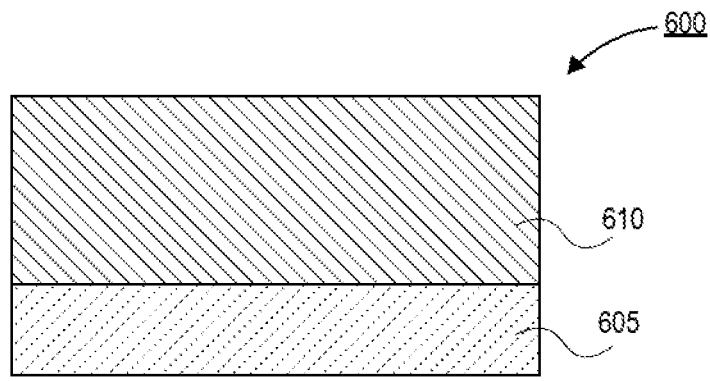
FIGS. 6A-6E are cross-sectional illustrations depicting a process for forming a Schottky diode with a compositional gradient using a sacrificial layer and a diffusion process, in accordance with an embodiment.

Referring now to FIG. 6A, a cross-sectional illustration of a portion of a diode 600 is shown, in accordance with an embodiment. As shown, the diode 600 may comprise a first electrode 605 and a semiconductor region 610 over the first electrode 605. The semiconductor region 610 may comprise a single material composition. That is, the semiconductor region 610 may comprise a single material composition through its thickness. For example, the semiconductor region 610 may comprise $In_2O_3$.

Figure 6B:
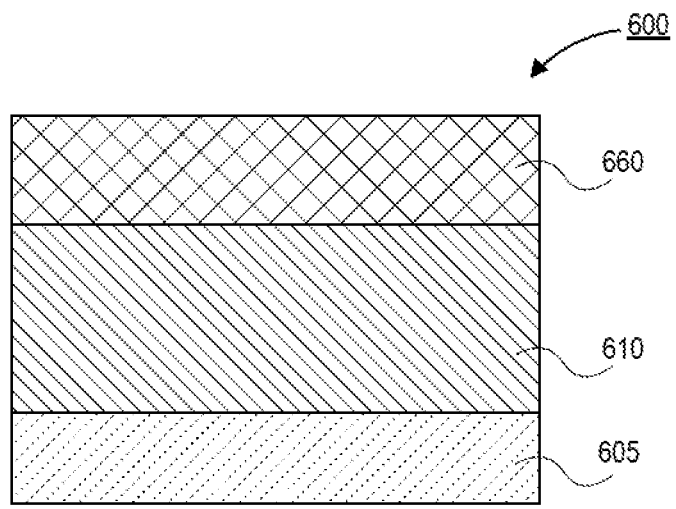

Referring now to FIG. 6B, a cross-sectional illustration of a portion of a diode 600 after a sacrificial layer 660 is disposed over a top surface of the semiconductor region 610 is shown, in accordance with an embodiment. In an embodiment, the sacrificial layer 660 may comprise a metal or various dielectrics suitable for doping the semiconductor regions 610.

Figure 6C:
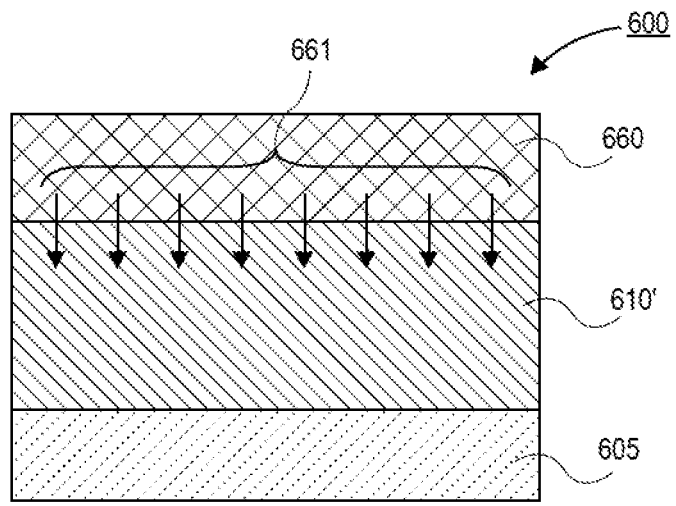

Referring now to FIG. 6C, a cross-sectional illustration of the diode 600 during an annealing process is shown, in accordance with an embodiment. The annealing process may drive diffusion of dopants 661 from the sacrificial layer 660 into the semiconductor region 610 to form a doped semiconductor region 610'. The annealing process results in the top portion of the doped semiconductor region 610' being highly doped and a compositional gradient being formed through a thickness of the doped semiconductor region 610'.

Figure 6D:
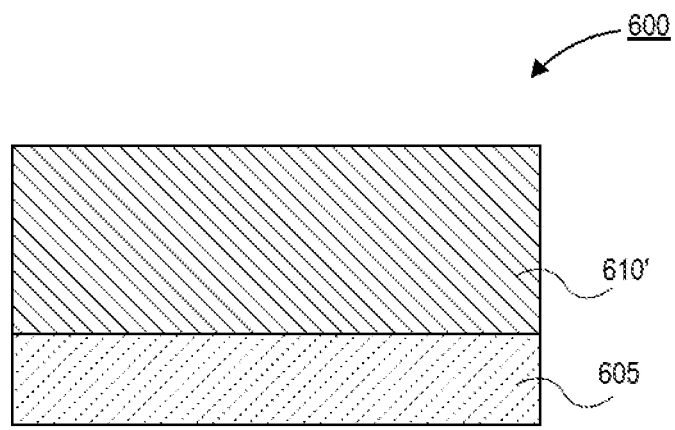

Referring now to FIG. 6D, a cross-sectional illustration of the diode 600 after the sacrificial layer 660 is removed is shown, in accordance with an embodiment. In an embodiment, the sacrificial layer 660 may be removed with an etching process, a polishing process, or the like.

Figure 6E:
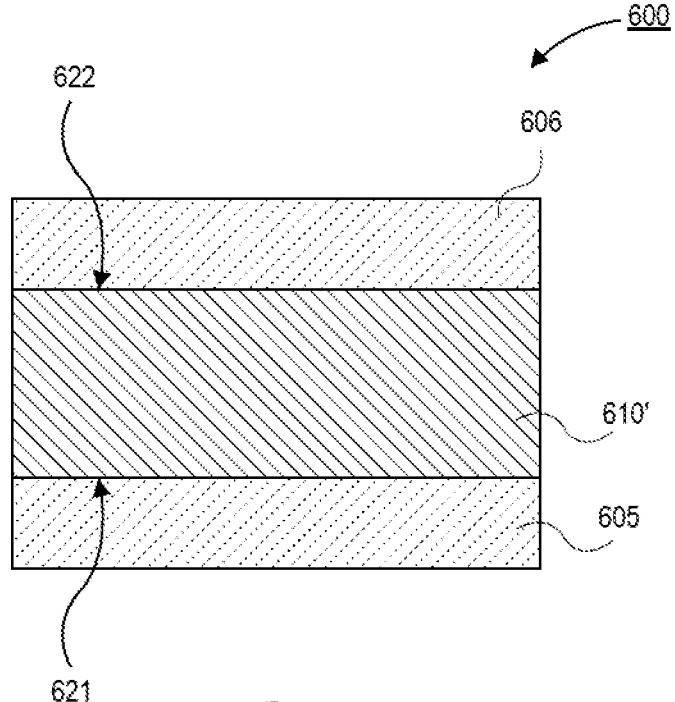

Referring now to FIG. 6E, a cross-sectional illustration of the diode 600 after a second electrode 606 is provided over the top surface of the doped semiconductor region 610' is shown, in accordance with an embodiment. In an embodiment, the compositional gradient of the doped semiconductor region 610' results in a first interface 621 with an ohmic contact, and a second interface 622 with a Schottky contact.

Figure 7:
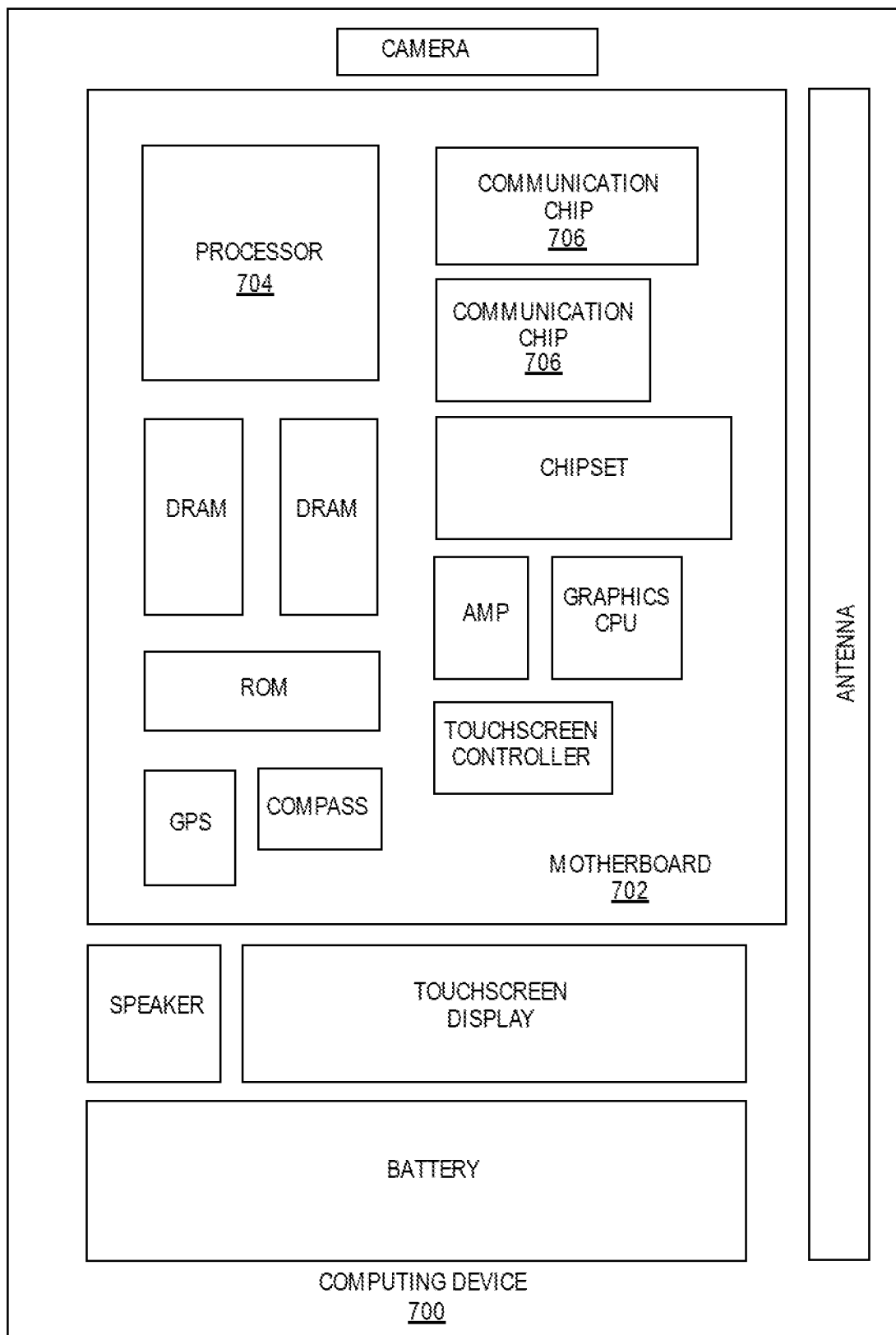
FIG. 7 illustrates a computing device in accordance with one implementation of an embodiment of the disclosure.

FIG. 7 illustrates a computing device 700 in accordance with one implementation of an embodiment of the disclosure. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In an embodiment, the integrated circuit die of the processor may comprise a diode in the BEOL stack that comprises a first interface with an ohmic contact and a second interface with a Schottky contact, as described herein. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In an embodiment, the integrated circuit die of the communication chip may comprise a diode in the BEOL stack that comprises a first interface with an ohmic contact and a second interface with a Schottky contact, as described herein.

In further implementations, another component housed within the computing device 700 may comprise a diode in the BEOL stack that comprises a first interface with an ohmic contact and a second interface with a Schottky contact, as described herein.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Figure 8:
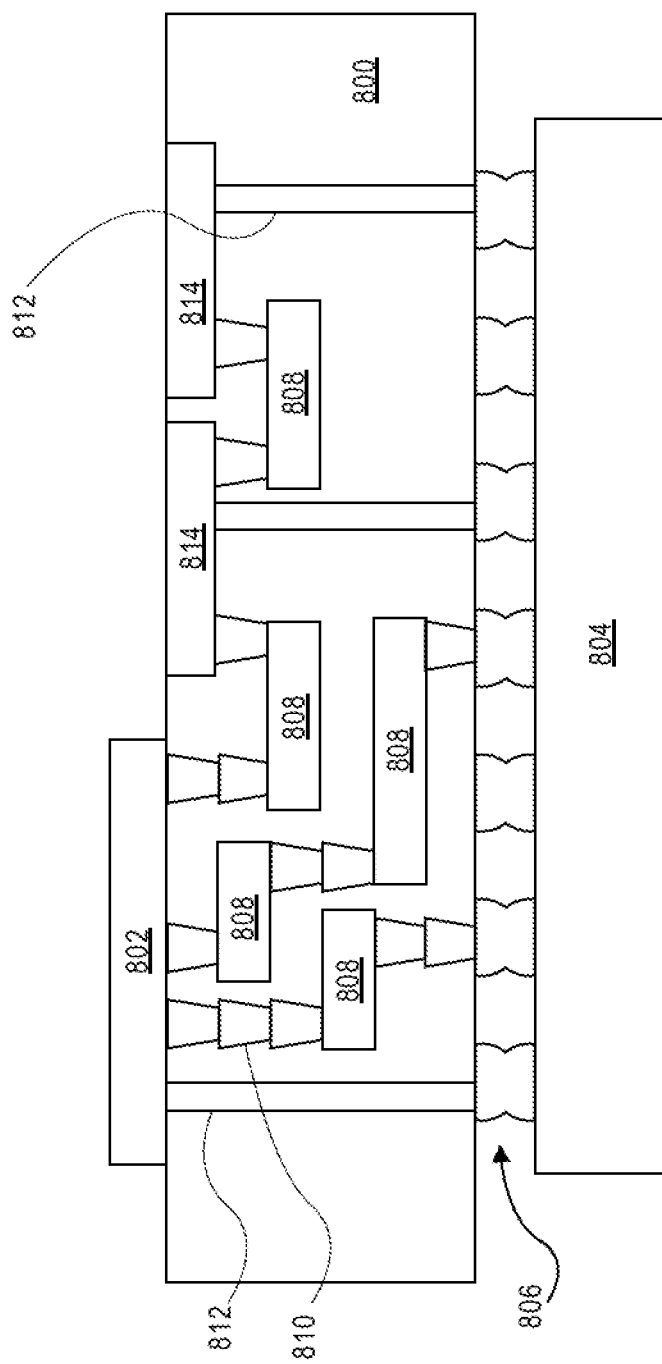
FIG. 8 is an interposer implementing one or more embodiments of the disclosure.

FIG. 8 illustrates an interposer 800 that includes one or more embodiments of the disclosure. The interposer 800 is an intervening substrate used to bridge a first substrate 802 to a second substrate 804. The first substrate 802 may be, for instance, an integrated circuit die. The second substrate 804 may be, for instance, a memory module, a computer motherboard, or another integrated circuit die. In an embodiment, one of both of the first substrate 802 and the second substrate 804 may comprise a diode in the BEOL stack that comprises a first interface with an ohmic contact and a second interface with a Schottky contact, in accordance with embodiments described herein. Generally, the purpose of an interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802/804 are attached to opposing sides of the interposer 800. In other embodiments, the first and second substrates 802/804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer 800 may be formed of alternate rigid or flexible materials that may include the same materials described above for use in a semiconductor substrate, such as silicon, germanium, and other group III-V and group IV materials.

The interposer 800 may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800. In accordance with embodiments of the disclosure, apparatuses or processes disclosed herein may be used in the fabrication of interposer 800.

Thus, embodiments of the present disclosure may comprise a diode in the BEOL stack that comprises a first interface with an ohmic contact and a second interface with a Schottky contact.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example 1: a semiconductor device, comprising: a semiconductor layer, wherein transistor devices are provided in the semiconductor layer; a back end stack over the semiconductor layer; and a diode in the back end stack, wherein the diode comprises: a first electrode; a semiconductor region over the first electrode; and a second electrode over the semiconductor region, wherein a first interface between the first electrode and the semiconductor region is an ohmic contact, and wherein a second interface between the semiconductor region and the second electrode is a Schottky contact.

Example 2: the semiconductor device of Example 1, wherein the semiconductor region comprises: a first layer, wherein the first layer has a first material composition; and a second layer over the first layer, wherein the second layer has a second material composition that is different than the first material composition.

Example 3: the semiconductor device of Example 2, wherein the first layer is part of the first interface, and wherein the second layer is part of the second interface.

Example 4: the semiconductor device of Example 3, wherein the first material composition comprises indium and oxygen.

Example 5: the semiconductor device of Example 3 or Example 4, wherein the second material composition comprises indium, gallium, zinc, and oxygen.

Example 6: the semiconductor device of Examples 1-5, wherein the semiconductor region comprises a compositional gradient from the first interface to the second interface.

Example 7: the semiconductor device of Example 6, wherein the compositional gradient starts at the first interface with a first material composition comprising indium and oxygen, and the compositional gradient ends at the second interface with a second material composition comprising gallium, zinc, and oxygen.

Example 8: the semiconductor device of Examples 1-7, wherein the first electrode and the second electrode comprise the same material composition.

Example 9: the semiconductor device of Examples 1-8, wherein the first electrode is part of a first trace extending in a first direction, and the second electrode is part of a second trace extending in a second direction that is substantially orthogonal to the first direction.

Example 10: the semiconductor device of Example 9, wherein the first trace is on a first metal layer in the back end stack, wherein the second trace is on a second metal layer in the back end stack, and wherein the semiconductor region is between the first metal layer and the second metal layer.

Example 11: the semiconductor device of Examples 1-10, wherein the diode is a selector for a memory in the back end stack.

Example 12: a method of forming a Schottky diode in a back end of line stack, comprising: forming a first electrode; forming a semiconductor region over the first electrode, wherein the semiconductor region comprises a compositional gradient between a first surface on the first electrode and a second surface opposite from the first surface; and forming a second electrode over the second surface, wherein a first interface between the semiconductor region and the first electrode is an ohmic contact, and wherein a second interface between the semiconductor region and the second electrode is a Schottky contact.

Example 13: the method of Example 12, wherein the compositional gradient is formed using binary oxide targets in a physical vapor deposition process.

Example 14: the method of Example 12, wherein the compositional gradient is formed with a process comprising: implanting the second surface with dopants; and annealing the semiconductor region to diffuse the dopants into the semiconductor region.

Example 15: the method of Example 12, wherein the compositional gradient is formed with a process comprising: forming a sacrificial layer over the semiconductor region; annealing the semiconductor region to drive diffusion of the sacrificial layer into the semiconductor region; and removing the sacrificial layer.

Example 16: the method of Examples 12-15, wherein the compositional gradient starts at the first interface with a first material composition comprising indium and oxygen, and the compositional gradient ends at the second interface with a second material composition comprising gallium, zinc, and oxygen.

Example 17: the method of Examples 12-16, wherein the first electrode is part of a first trace extending in a first direction, and the second electrode is part of a second trace extending in a second direction that is substantially orthogonal to the first direction.

Example 18: an electronic system, comprising: a board; a package substrate coupled to the board; and a die coupled to the package substrate, wherein the die comprises: a semiconductor layer, wherein transistor devices are provided in the semiconductor layer; a back end stack over the semiconductor layer; and a diode in the back end stack, wherein the diode comprises: a first electrode; a semiconductor region over the first electrode; and a second electrode over the semiconductor region, wherein a first interface between the first electrode and the semiconductor region is an ohmic contact, and wherein a second interface between the semiconductor region and the second electrode is a Schottky contact.

Example 19: the electronic system of Example 18, wherein the semiconductor region comprises: a first layer, wherein the first layer has a first material composition; and a second layer over the first layer, wherein the second layer has a second material composition that is different than the first material composition.

Example 20: the electronic system of Example 18 or Example 19, wherein the semiconductor region comprises a compositional gradient from the first interface to the second interface.

What is claimed is:

1. A semiconductor device, comprising:
   a semiconductor layer, wherein transistor devices are provided in the semiconductor layer;
   a back end stack over the semiconductor layer; and
   a diode in the back end stack, wherein the diode comprises:
   a first electrode;
   a semiconductor region over the first electrode; and
   a second electrode over the semiconductor region, wherein the first electrode and the second electrode have a same composition, wherein a first interface between the first electrode and the semiconductor region is an ohmic contact, and wherein a second interface between the semiconductor region and the second electrode is a Schottky contact, wherein the semiconductor region grades from a composition of $SrTiO_3$ at the first interface to a composition of $SrRuO_3$ at the second interface, wherein the first electrode is part of a first trace extending in a first direction, and the second electrode is part of a second trace extending in a second direction that is substantially orthogonal to the first direction, and wherein the first electrode and the second electrode vertically overlap along the first direction and the second direction from a plan view perspective.

2. The semiconductor device of claim 1, wherein the first trace is on a first metal layer in the back end stack, wherein the second trace is on a second metal layer in the back end stack, and wherein the semiconductor region is between the first metal layer and the second metal layer.

3. The semiconductor device of claim 1, wherein the diode is a selector for a memory in the back end stack.

4. A method of forming a Schottky diode in a back end of line stack, comprising:
   forming a first electrode;
   forming a semiconductor region over the first electrode; and
   forming a second electrode over the second surface, wherein the first electrode and the second electrode have a same composition, wherein a first interface between the semiconductor region and the first electrode is an ohmic contact, and wherein a second interface between the semiconductor region and the second electrode is a Schottky contact, wherein the semiconductor region grades from a composition of $SrTiO_3$ at the first interface to a composition of $SrRuO_3$ at the second interface, wherein the first electrode is part of a first trace extending in a first direction, and the second electrode is part of a second trace extending in a second direction that is substantially orthogonal to the first direction, and wherein the first electrode and the second electrode vertically overlap along the first direction and the second direction from a plan view perspective.

5. The method of claim 4, wherein the compositional gradient is formed using binary oxide targets in a physical vapor deposition process.

6. The method of claim 4, wherein the compositional gradient is formed with a process comprising:
   implanting the second surface with dopants; and
   annealing the semiconductor region to diffuse the dopants into the semiconductor region.

7. The method of claim 4, wherein the compositional gradient is formed with a process comprising:
   forming a sacrificial layer over the semiconductor region;
   annealing the semiconductor region to drive diffusion of the sacrificial layer into the semiconductor region; and
   removing the sacrificial layer.

8. An electronic system, comprising:
   a board;
   a package substrate coupled to the board; and
   a die coupled to the package substrate, wherein the die comprises:
   a semiconductor layer, wherein transistor devices are provided in the semiconductor layer;
   a back end stack over the semiconductor layer; and
   a diode in the back end stack, wherein the diode comprises:
   a first electrode;
   a semiconductor region over the first electrode; and
   a second electrode over the semiconductor region, wherein the first electrode and the second electrode have a same composition, wherein a first interface between the first electrode and the semiconductor region is an ohmic contact, and wherein a second interface between the semiconductor region and the second electrode is a Schottky contact, wherein the semiconductor region grades from a composition of $SrTiO_3$ at the first interface to a composition of $SrRuO_3$ at the second interface, wherein the first electrode is part of a first trace extending in a first direction, and the second electrode is part of a second trace extending in a second direction that is substantially orthogonal to the first direction, and wherein the first electrode and the second electrode vertically overlap along the first direction and the second direction from a plan view perspective.

* * * * *